US008717652B2

(12) United States Patent
Takahashi

(10) Patent No.: US 8,717,652 B2
(45) Date of Patent: May 6, 2014

(54) MICRO SCANNER DEVICE AND METHOD FOR CONTROLLING MICRO SCANNER DEVICE

(75) Inventor: Utako Takahashi, Nagaokakyo (JP)

(73) Assignee: Konica Minolta Opto, Inc., Tokyo (JP)

( * ) Notice: Subject to any disclaimer, the term of this patent is extended or adjusted under 35 U.S.C. 154(b) by 345 days.

(21) Appl. No.: 12/811,944

(22) PCT Filed: Dec. 19, 2008

(86) PCT No.: PCT/JP2008/073182
§ 371 (c)(1),
(2), (4) Date: Jul. 7, 2010

(87) PCT Pub. No.: WO2009/087883
PCT Pub. Date: Jul. 16, 2009

(65) Prior Publication Data
US 2010/0277783 A1 Nov. 4, 2010

(30) Foreign Application Priority Data

Jan. 10, 2008 (JP) .................................. 2008-002780

(51) Int. Cl.
G02B 26/08 (2006.01)
G02B 26/10 (2006.01)
G02B 26/12 (2006.01)
(52) U.S. Cl.
USPC .................... 359/198.1; 359/199.1; 359/214.1
(58) Field of Classification Search
None
See application file for complete search history.

(56) References Cited

U.S. PATENT DOCUMENTS

| 7,394,583 | B2 | 7/2008 | Akedo et al. ................. 359/223 |
| 2005/0219674 | A1 | 10/2005 | Asai et al. ..................... 359/213 |
| 2005/0243396 | A1 | 11/2005 | Fujii et al. .................... 359/224 |
| 2007/0070481 | A1 | 3/2007 | Nishikawa et al. ........... 359/201 |
| 2007/0146858 | A1 | 6/2007 | Matsuda ....................... 359/224 |
| 2007/0158552 | A1 | 7/2007 | Kim et al. ................. 250/306 R |
| 2007/0171500 | A1 | 7/2007 | Jeong et al. .................. 359/224 |
| 2007/0268544 | A1 | 11/2007 | Ueyama ....................... 359/225 |
| 2007/0269199 | A1 | 11/2007 | Mori et al. ................... 396/322 |

FOREIGN PATENT DOCUMENTS

| EP | 1 806 613 A1 | 7/2007 |
| JP | 10-104543 A | 4/1998 |
| JP | 2005-308863 A | 11/2005 |
| JP | 2006-293116 A | 10/2006 |
| JP | 2007-188073 A | 7/2007 |
| KR | 10-0682958 B1 | 2/2007 |
| WO | WO 2009/087883 A1 | 7/2009 |

OTHER PUBLICATIONS

Extended European Search Report dated Jul. 25, 2011, for counterpart European Patent Application No. 08869942.6.
English language translation of Office Action dated Nov. 6, 2012 in the corresponding Japanese Patent Application No. JP 2009-548878.
Communication from the European Patent Office dated Apr. 25, 2013 in the corresponding EPO application No. 08 869 942.6-1553.

*Primary Examiner* — Jade R Chwasz
(74) *Attorney, Agent, or Firm* — Cozen O'Connor

(57) ABSTRACT

A mirror axis (MA) is displaced by deformation of a holder (HD) and with resonance of an optical scanner (LS) itself according to the frequency of a voltage applied to a piezoelectric element (PE). The frequency of the applied voltage for causing a resonance deforms the holder (HD) so as to generate at least one node intersecting with respect to the length of the holder (HD) itself.

13 Claims, 11 Drawing Sheets

FIRST VIBRATION MODE

SECOND VIBRATION MODE

THIRD VIBRATION MODE

FOURTH VIBRATION MODE

MICRO SCANNER DEVICE AND METHOD FOR CONTROLLING MICRO SCANNER DEVICE

RELATED APPLICATIONS

This is a U.S. National Phase under 35 U.S.C. §371 of International Application No. PCT/JP2008/073182, filed in the Japanese Patent Office on Dec. 19, 2008, which claims priority to Japanese Patent Application No. 2008-002780, filed Jan. 10, 2008.

TECHNICAL FIELD

The present invention relates to a micro scanner device including a micro scanner such as an optical scanner, and to a method for controlling the micro scanner device.

BACKGROUND ART

Conventionally, various compact optical scanners (micro scanners) have been developed that use a MEMS (micro electro mechanical systems) technology. For example, as shown in FIGS. 11A and 11B, in an optical scanner disclosed in Patent Document 1, a cantilever beam hd that supports a twisted beam ma connected to a mirror (moving portion) mr is resonated with an electrical signal applied to a piezoelectric element pe provided on a base member bs, and, with that resonance, the mirror mr is swung comparatively greatly.
Patent Document 1: JP-A-2006-293116

DISCLOSURE OF THE INVENTION

Problems to be Solved by the Invention

As disclosed in Patent Document 1, in an optical scanner is that uses resonance, the mirror mr is swung more greatly than in an optical scanner that does not use resonance. However, in a case where the cantilever beam hd is deformed with resonance of first vibration mode (in a case of a vibration mode where no point, i.e., no so called node, occurs at which the amplitude is zero under steady state oscillation) particularly as shown in FIGS. 11A and 11B, if the cantilever beam hd itself is short, the amount of displacement of the cantilever beam hd is not significantly large. Thus, the rotation angle of the mirror mr is not sufficiently large.

In order to increase the amount of displacement of the cantilever beam hd in such first vibration mode, the cantilever beam hd may be extended in length. However, if the cantilever beam hd is too long, the resonance frequency generally decreases. This prevents the mirror mr from moving at high speed.

The present invention has been devised under the above background. An object of the invention is to provide a micro scanner including a mirror (a moving portion) or the like that is able to move at high speed, a scanner device that is provided with the micro scanner, etc.

Means for Solving the Problem

A micro scanner device comprises a micro scanner and a drive circuit.

A one dimensional micro scanner includes: a fixing frame serving as an outer frame; an axis portion; a holder having a cantilever beam structure in which one end of the holder is connected to the axis portion and another end of the holder is fixed to the fixing frame; a drive portion generating, in response to a voltage applied thereto, a force for deforming the holder; and a moving portion swinging with respect to the axis portion according to displacement of the axis portion. The drive circuit applies to the drive portion a voltage having a frequency that is approximate to or equal to the natural frequency of the micro scanner itself and that generates in the holder at least one node intersecting with respect to the length of the holder.

A two dimensional micro scanner includes: a fixing frame serving as an outer frame; a first axis portion and a second axis portion having axis directions different from one another; a holder having a cantilever beam structure in which one end of the holder is connected to the second axis portion and another end of the holder is fixed to the fixing frame; a drive portion generating, in response to a voltage applied thereto, a force for deforming the holder; and a moving portion, on one hand, swinging with respect to the first axis portion according to displacement of the first axis portion and, on the other hand, swinging with respect to the second axis portion according to displacement of the second axis portion. In the two dimensional micro scanner, the second axis portion is displaced by deformation of the holder alone, whereas the first axis portion is displaced with resonance. In addition, the drive circuit applies to the drive portion a voltage having a frequency that is approximate to or equal to the natural frequency of the above described two dimensional micro scanner itself and that generates in the holder at least one node intersecting with respect to the length of the holder.

For example, if one end of the holder in the length thereof is assumed to be a fixed end and another end a free end, the free end is displaced at a higher frequency in a case as described above where driving is performed by the holder being so deformed as to have a node (a point at which the amplitude is zero under steady state oscillation) than in a case where driving is performed by the holder being so deformed as to have no node. The amount of displacement of the free end in the holder is the deformation of the holder itself; thus, if the first and second axis portions are to be displaced by that deformation, the amount of displacement of the moving portion that swings with respect to the first axis portion and with respect to the second axis portion increases.

Generally, the longer the holder is, the more likely it is to be deformed. Thus, in order to obtain a comparatively large amount of displacement, the holder is preferably long. It should be noted that, in a case where the holder is deformed so as to have no node, the frequency of the voltage applied to the drive portion generally tends to be low. This results in a slow swinging speed of the moving portion. However, in a case where the holder is deformed so as to have a node, the frequency of the voltage applied to the drive portion generally tends to be high; as a result, even if the holder is comparatively long, the holder is deformed comparatively greatly at a higher frequency.

That is, in the micro scanner, the holder so deformed as to have a node to thereby displace a comparatively long holder greatly at a higher frequency. In other words, the frequency of the voltage applied to the drive portion is set comparatively high and, at that high frequency, the micro scanner resonates. Thus, the swinging speed, which is dependent on that frequency, increases, i.e., those one dimensional and two dimensional micro scanners scan at high speed.

In a micro scanner device including the one dimensional micro scanner, desirably, the natural frequency of a system (for example, a unimorph) that includes the holder and the drive portion is approximate to or equal to the natural frequency of a system (for example, the entire micro scanner) that includes the axis portion, the holder, the drive portion, the moving portion, and the fixing frame which surrounds the axis portion, the holder, the drive portion, and the moving portion.

In the two dimensional micro scanner, desirably, the natural frequency of a system (for example, a unimorph) that includes the holder and the drive portion is approximate to or equal to the natural frequency of a system (for example, the entire micro scanner) that includes the first axis portion, the second axis portion, the holder, the drive portion, the moving portion, and the fixing frame which includes the first axis portion, the second axis portion, the holder, the drive portion, and the moving portion.

In this way, the peak value of the resonance of the micro scanner tends to increase, which is accompanied by an increased rotation angle of the moving portion that swings with respect to the first axis portion.

In a case where the holder is apart from the drive portion, for example, in a case where the drive portion is an electrostatic unit formed of two electrodes, it is desirable, in the one dimensional micro scanner, that the natural frequency of the holder be approximate to or equal to the natural frequency of a system (for example, the entire micro scanner) that includes the axis portion, the holder, the moving portion, and the fixing frame which surrounds the axis portion, the holder, and the moving portion.

In addition, it is desirable, in the two dimensional micro scanner, that the natural frequency of the holder be approximate to or equal to the natural frequency of a system (for example, the entire micro scanner) that includes the first axis portion, the second axis portion, the holder, the moving portion, and the fixing frame which surrounds the first axis portion, the second axis portion, the holder, and the moving portion.

In this way also, the peak value of the resonance of the micro scanner tends to increase, which is accompanied by an increased rotation angle of the moving portion that swings with respect to the first axis portion.

In a method for controlling a micro scanner device comprising a one dimensional micro scanner as described above and a drive circuit, a voltage is applied to a drive portion by the drive circuit, the voltage having a frequency that is approximate to or equal to the natural frequency of the micro scanner itself and that generates in a holder at least one node intersecting with respect to the length of the holder.

Moreover, in a method for controlling a micro scanner device comprising a two dimensional micro scanner as described above and a drive circuit, a second axis portion is displaced by deformation of a holder alone, whereas a first axis portion is displaced with resonance. In addition, in the method for controlling the micro scanner device, a voltage is applied to a drive portion by the drive circuit, the voltage having a frequency that is approximate to or equal to the natural frequency of the two dimensional micro scanner itself and that generates in the holder at least one node intersecting with respect to the length of the holder.

Advantages of the Invention

According to the present invention, even with a comparatively long holder, the holder is easily deformed greatly at a high frequency. This leads to an increased swinging speed of a swinging moving portion.

LIST OF REFERENCE SYMBOLS

MR mirror (moving portion)
MA mirror axis (axis portion, first axis portion)
FM movable frame
FA frame axis (second axis portion)
HD holder
HD1 first holder
HD2 second holder
PE piezoelectric element (drive portion)
TB torsion bar
ST slit
FF fixing frame
LS optical scanner (micro scanner)

BEST MODE FOR CARRYING OUT THE INVENTION

[First Embodiment]

A first embodiment of the present invention will be described below with reference to the relevant drawings. Here, a mirror is taken up as an example of a member (a moving portion) that moves, and an optical scanner is taken up as an example of a micro scanner that performs scanning operation by moving the mirror to thereby reflect light.

To facilitate understanding, hatching is used even in a plan view. For the sake of convenience, a reference sign or hatching may be omitted, in which case another diagram will be referred to. A solid black circle on a drawing means a direction perpendicular to the plane of the figures.

Figure 1:
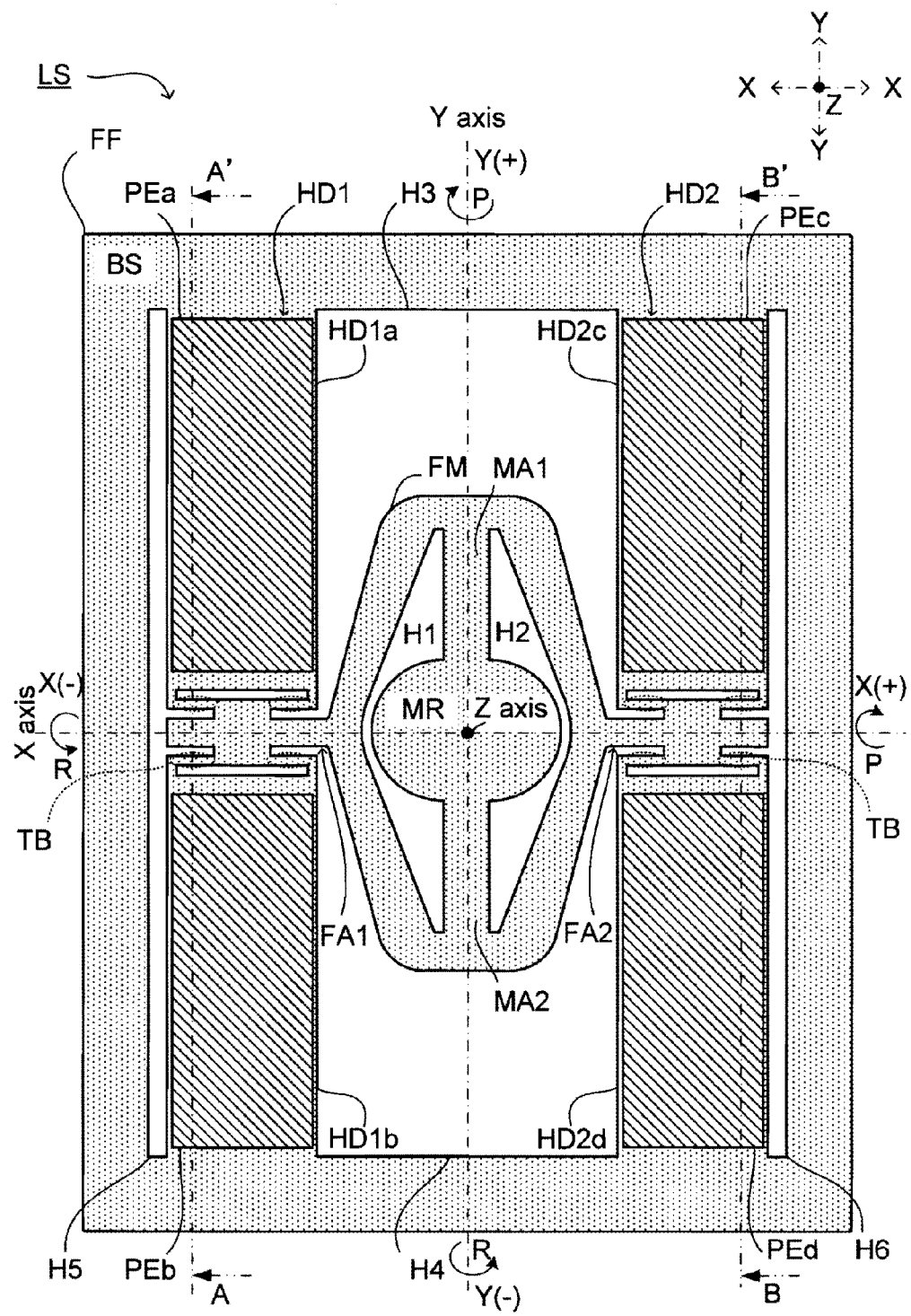
[FIG. 1] A plan view of a two dimensional optical scanner.
Figure 2:
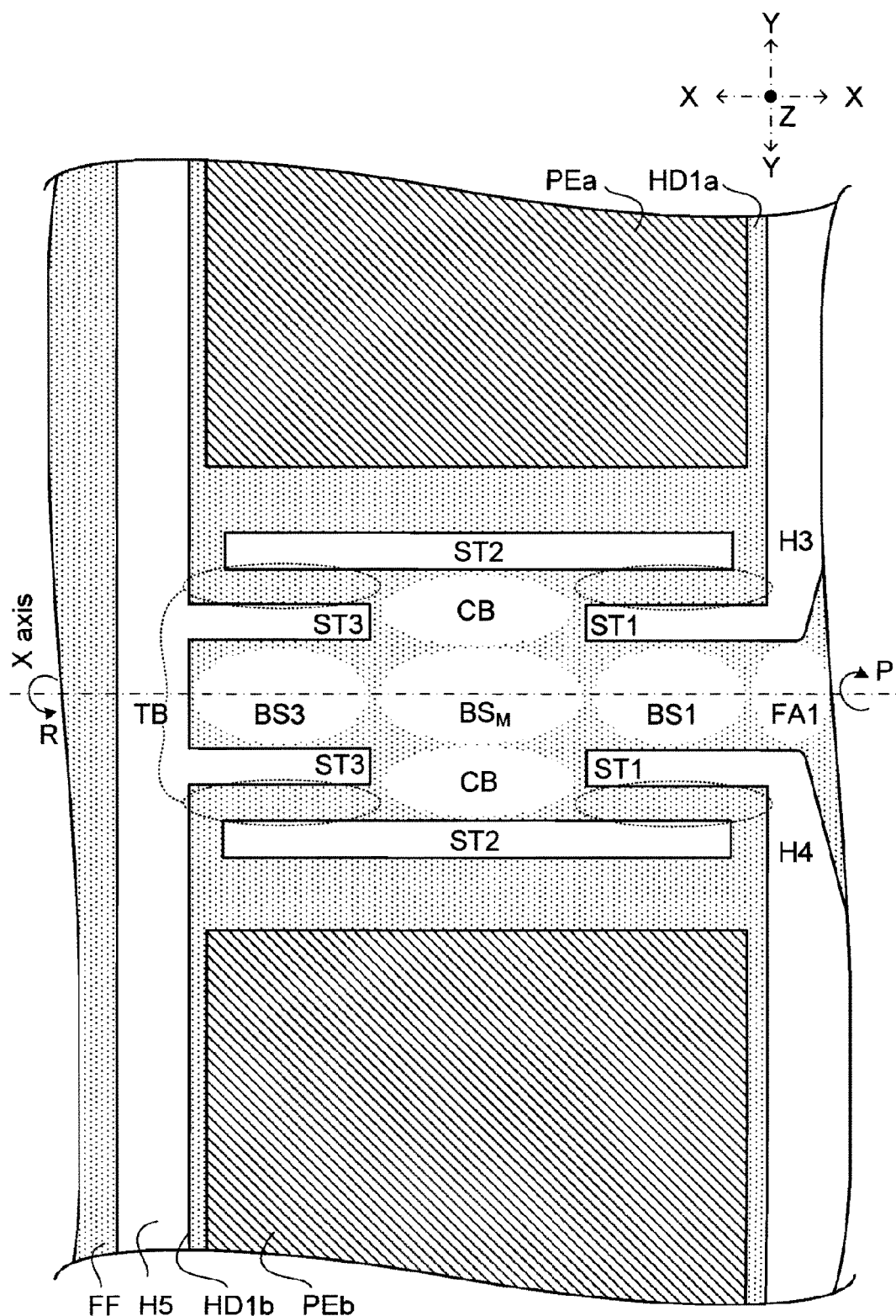
[FIG. 2] An enlarged view of a part of the optical scanner shown in FIG. 1.

FIG. 1 is a plan view of an optical scanner LS, and FIG. 2 is an enlarged view of a part of FIG. 1. As shown in FIG. 1, the optical scanner LS includes a mirror MR, a mirror axis MA, a movable frame FM, a frame axis FA, a holder HD, a piezoelectric element PE, torsion bars TB, and a fixing frame FF. These members are formed by etching a deformable silicon substrate or the like which serves as a base member BS.

The mirror (moving portion) MR reflects light from a light source or the like, and is formed by attaching a reflective film of metal, aluminum, or the like to a part of the base member BS. For example, as shown in FIG. 1, as a result of openings H (a first opening H1 and a second opening H2) that include semicircular narrowed portions and sandwiching portions sandwiching those semicircular narrowed portions being oppositely located, a remaining portion—which includes a circle—of the base member BS is created. Then, a reflective film is attached to a part of the remaining portion to complete the mirror MR.

A direction in which the first opening H1 and the second opening H2 are arrayed will be referred to as the X direction, and let the second opening H2 side of the X direction be plus {X (+)} of the X direction, and let the opposite direction with respect to the + direction be minus {(X (−)} of the X direction. Furthermore, a direction extending in the X direction from the center of the mirror MR will be referred to as the X axis.

As a result of the sandwiching portion of the first opening H1 and the sandwiching portion of the second opening H2 being oppositely located, the mirror axis (a first axis portion) MA—an axial portion—is so created as to connect to one end and the other end of the mirror MR. One mirror axis MA (a first mirror axis MA1) connected to one end of the mirror MR and the other mirror axis MA (a second mirror axis MA2) connected to the other end of the mirror MR extend from the mirror MR in directions different from each other (note that the first mirror axis MA1 and the second mirror axis MA2 are parallel).

The direction in which the mirror axis MA extends is orthogonal to (intersects with) the X direction. Here, a direction in which the mirror axis MA extends will be refereed to as the Y direction, and let the first mirror axis MA1 side of the Y direction be plus {Y (+)} of the Y direction, and let the opposite direction with respect to the + direction be minus {(Y (−)} of the Y direction. Furthermore, a direction extending in the Y direction from the center of the mirror MR will be referred to as the Y axis.

In addition, let the direction orthogonal to the X direction and the Y direction be the Z direction (a warping direction), and, for the sake of convenience, let a light receiving side of the mirror MR be plus {Z (+)} of the Z direction, and let the opposite direction with respect to the + direction be minus {(Z (−)} of the Z direction. Furthermore, a direction extending in the Z direction from the point of intersection of the X axis and the Y axis will be referred to as the Z axis.

The movable frame FM is a frame surrounding the mirror MR and the mirror axis MA. For example, of bracket like ("]" like) two openings H, forming one opening H—a third opening H3—so as to surround the first mirror axis MA1 and forming the other opening H—a fourth opening H4—so as to surround the second mirror axis MA2 creates two remaining portions of the base member BS, specifically a remaining portion which is sandwiched by the third opening H3 and the first and second openings H1 and H2, and a remaining portion which is sandwiched by the fourth opening H4 and the first and second openings H1 and H2. Then, those two remaining portions serve as a frame shaped part of the base member BS that surrounds the mirror MR and the mirror axis MA, namely the movable frame FM.

The frame axis (a second axis portion) FA holds the movable frame FM, at the outer periphery thereof, by extending outward from one end and the other end of the movable frame FM that coincide with the X axis and are opposite from each other. For example, when the bracket like third and fourth openings H3 and H4 are oppositely located and when both ends of the third opening H3 and both ends of the fourth opening H4 are oppositely located, parts of the base member BS sandwiched by those both ends have a bar shape, and that bar shaped parts serve as the frame axis FA. Hereinafter, one part of the frame axis FA extending toward the X (−) side will be referred to as a first frame axis FA1, and the other part of the frame axis FA extending toward the X (+) side will be referred to as a second frame axis FA2.

The holder HD holds the frame axis FA (the holder HD is connected to the frame axis FA) to thereby hold the movable frame FM. This holder HD is formed by a remaining portion of the base member BS which is created between openings H (a fifth opening H5 and a sixth opening H6) extending in the Y direction and the third and fourth openings H3 and H4.

To be specific, the fifth opening H5 and the sixth opening H6 are arrayed along the X direction, and sandwich the third and fourth openings H3 and H4. Then, a remaining portion of the base member BS which is located between the fifth opening H5 and the third and fourth openings H3 and H4 and extending in the Y direction serves as a first holder HD1, and a remaining portion of the base member BS which is located between the sixth opening H6 and the third and fourth openings H3 and H4 and extending in the Y direction serves as a second holder HD2. Note that such a holder HD with a shape (a linear shape) extending in the Y direction tends to warp.

The piezoelectric element PE (PEa to PEd) is an element converting a voltage into a force. The piezoelectric element PE includes a piezoelectric member PB (PBa to PBd) that has been subjected to polarization treatment and electrodes EE1 and EE2 (EE1a to EE1d and EE2a to EE2d) that sandwich the piezoelectric member PB (see FIGS. 3 and 4 described below). With the piezoelectric element (a drive portion) PE attached on the surface of the holder HD, a unimorph (an actuator) YM is formed. To be specific, with one electrode (a first electrode) EE1 in the piezoelectric element PE and one surface of the holder HD attached together, the unimorph YM (YMa to YMd) is formed.

Then, with a voltage (an AC voltage) of ± within a range where no polarization inversion is caused applied between the first electrode EE1 and the second electrode EE2, the piezoelectric member PB expands and contracts, and, according to the expansion and the contraction, the unimorph YM warps.

The piezoelectric elements PEa and PEb are attached to the first holder HD1 so as to sandwich the first frame axis FA1. The piezoelectric elements PEc and PEd are attached to the second holder HD2 so as to sandwich the second frame axis FA2. Thus, in response to deformation of expansion/contraction of the piezoelectric members PB (PBa to PBd) in the piezoelectric elements PEa and PEb and the piezoelectric elements PEc and PEd, the holder HD also is deformed (warps to be deformed or bends to be deformed).

Hereinafter, it is assumed that one strip of the first holder HD1 to which the piezoelectric element PEa is attached be a holding strip HD1a, one strip of the first holder HD1 to which the piezoelectric element PEb is attached be a holding strip HD1b, one strip of the second holder HD2 to which the piezoelectric element PEc is attached be a holding strip HD2c, and one strip of the second holder HD2 to which the piezoelectric element PEd is attached be a holding strip HD2d.

The torsion bars TB are members for changing the deformation (warping deformation or the like) of the holder HD into twisting deformation (rotational torque) and transmitting it to the frame axis FA (see parts indicated by dotted lines in FIGS. 1 and 2). These torsion bars TB are formed in the holder HD.

As an example, as shown in FIG. 2, parts of the base member BS serve as the torsion bars TB, the parts being located between first slits ST1 and ST1 extending in the X direction from ends of the third and fourth openings H3 and H4 and second slits ST2 and ST2 extending in the same direction (the X direction) as the first slits ST1 and ST1 and arrayed in parallel along the Y direction.

Another parts of the base member BS serve as the torsion bars TB, the parts being located between third slits ST3 connected to the fifth opening H5, specifically, third slits ST3 extending in the X direction and arranged in lines with the first slits ST1 in the X direction and the second slits ST2.

As a result of the torsion bars TB created by the slits ST existing in the holder HD, gaps are created in the holder HD. Thus, due to the existence of the gaps, the rigidity of the holder HD decreases. Consequently, the holder HD tends to warp.

In particular, those torsion bars TB extend in a direction (for example in the X direction) intersecting with the direction (the Y direction) in which the holder HD extends. This makes it easier for the torsion bars TB to twist in a case where the holder HD warps.

A part BS1 of the base member BS which is located between the first slits ST1 and ST1 is connected to the frame axis FA. A part BS3 of the base member BS which is located between the third slits ST3 and ST3 is arranged along the axis direction of the frame axis FA. Thus, those two parts BS1 and BS3 and a part $BS_M$ of the base member BS which is located between the two parts BS1 and BS3 may be collectively referred to as the frame axis FA. In addition, parts of the base member BS which is located between the part $BS_M$ and the second slits ST2 connect the torsion bars TB and the frame axis FA. Thus, those parts are referred to as connecting portions CB.

The fixing frame FF is an outer frame of the optical scanner LS. Specifically, the fixing frame FF is a frame shaped member surrounding the mirror MR, the mirror axis MA, the movable frame FM, the frame axis FA, the holder HD, the piezoelectric element PE, and the torsion bars TB.

A description will now be given of the inclination of the mirror MR in the optical scanner LS as described above. In the optical scanner LS, the mirror MR is swingable (rotatetable) with respect to the frame axis FA, and in addition the mirror MR is swingable with respect to the mirror axis MA. First, a description will be given of the swinging of the mirror MR with respect to the frame axis FA (the X axis) using FIG. 1, and FIGS. 3A and 3B which are cross sectional views taken along line A-A' in FIG. 1.

Figure 3A:
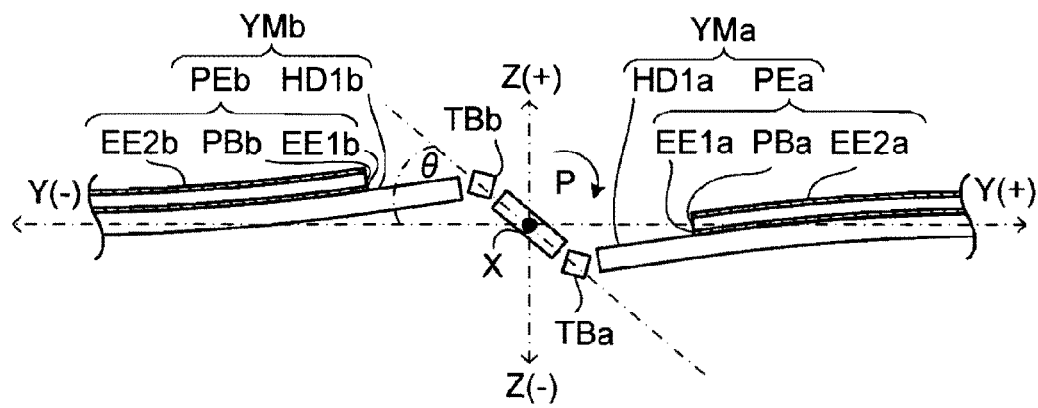
[FIG. 3A] A cross sectional view taken along line A-A' in FIG. 1, showing a state of normal rotation with respect to a frame axis.
Figure 3B:
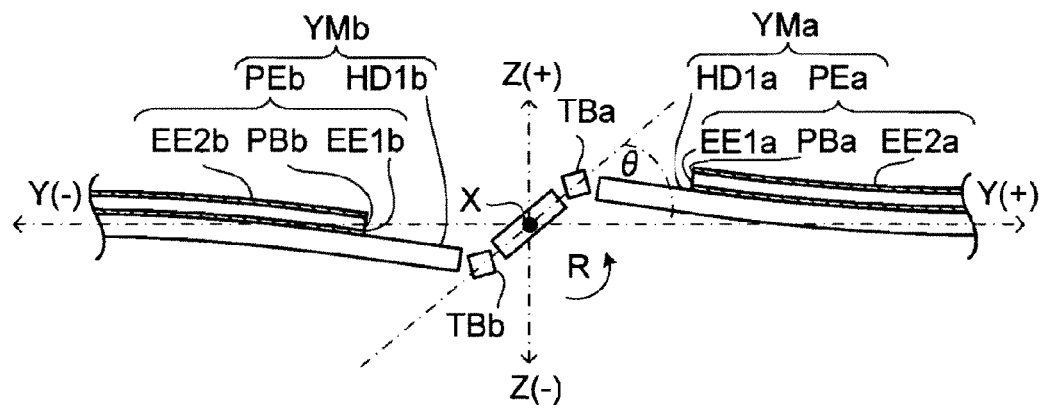
[FIG. 3B] A cross sectional view taken along line A-A' in FIG. 1, showing a state of reverse rotation with respect to the frame axis.

Let one direction with respect to the frame axis FA {a clockwise rotation as viewed from X (+) to X (−)} be normal rotation P, and let rotation in a direction opposite from the normal direction (counterclockwise rotation) be reverse rotation R. FIG. 3A shows the deformation of the first holder HD1 in a case where the mirror MR rotates in the normal direction, and FIG. 3B shows the deformation of the first holder HD1 in a case where the mirror MR rotates in the reverse direction.

Hereinafter, though a description will be given of the first holder HD1 alone which is one of the two holders HD, when the one first holder HD1 attempts to rotate the mirror MR in the normal direction or in the reverse direction, the other second holder HD2 deforms in a similar manner, i.e., rotates the mirror MR in the normal direction or in the reverse direction.

As shown in FIG. 3A, in a case where the mirror MR rotates with respect to the frame axis FA in the normal direction, a voltage for expanding the piezoelectric member PBa is applied, and in addition a voltage (a voltage of opposite phase from the voltage applied to the piezoelectric member PBa) for contracting the piezoelectric member PBb is applied.

When such voltages are applied, expansion of the piezoelectric member PBa causes the holding strip HD1a—to which the first electrode EE1a is attached—of the first holder HD1 to warp so as to bulge toward the Z (+) side. Consequently, the first frame axis FA1 side of the holding strip HD1a sags toward Z (−). On the other hand, contraction of the piezoelectric member PBb causes the holding strip HD1b—to which the first electrode EE1b is attached—of the first holder HD1 to warp so as to bulge toward the Z (−) side. Consequently, the first frame axis FA1 side of the holding strip HD1b springs up toward Z (+).

When such warping occurs in the holding strips HD1a and HD1b, the Y (+) side of the first frame axis FA1 is pushed down via the torsion bars TB (TBa), and the Y (−) side of the first frame axis FA1 is pushed up via the torsion bars TB (TBb). In such cases, the torsion bars TBa and TBb easily twist with respect to their axis directions (the bar axis directions), and the first frame axis FA1 is displaced. As a result, the mirror MR rotates with respect to the frame axis FA in the normal direction.

On the other hand, as shown in FIG. 3B, in a case where the mirror MR rotates in the reverse direction, a voltage for contracting the piezoelectric member PBa is applied, and in addition a voltage for expanding the piezoelectric member PBb is applied.

When such voltages are applied, contraction of the piezoelectric member PBa causes the holding strip HD1a—to which the first electrode EE1a is attached—to warp so as to bulge toward the Z (−) side. Consequently, the first frame axis FA1 side of the holding strip HD1a springs up toward Z (+). On the other hand, expansion of the piezoelectric member PBb causes the holding strip HD1b—to which the first electrode EE1b is attached—to warp so as to bulge toward the Z (+) side. Consequently, the first frame axis FA1 side of the holding strip HD1b sags toward Z (−).

When such warping occurs in the holding strips HD1a and HD1b, the Y (+) side of the first frame axis FA1 is pushed up via the torsion bars TBa, and the Y (−) side of the first frame axis FA1 is pushed down via the torsion bars TBb. This displaces the first frame axis FA1 reversely with respect to the case where the first frame axis FA1 is rotated in the normal direction. Thus, the mirror MR rotates with respect to the frame axis FA in the reverse direction.

As described above, the mirror MR is swung (rotated in the normal direction or in the reverse direction) by utilizing the twisting deformation of the torsion bars TB which facilitates swinging of the frame axis FA and the warping of the holding strips HD1a and HD1b (namely the holder HD). Thus, the amount of swinging (a rotation angle θ of normal rotation or reverse rotation) of such a frame axis FA is large (in other words, the amount of swinging of the frame axis FA is efficiently ensured) as compared with a case where the frame axis FA is swung by use of the warping of the holder HD alone.

Figure 4A:
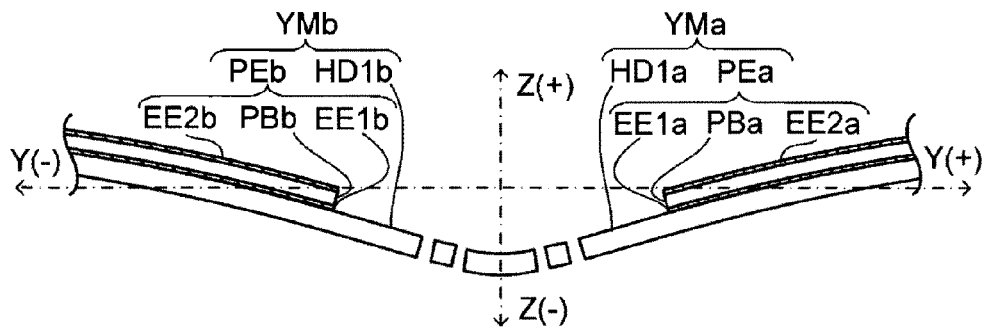
[FIG. 4A] A cross sectional view taken along line A-A' in FIG. 1, showing movement of normal rotation with respect to a mirror axis.
Figure 4B:
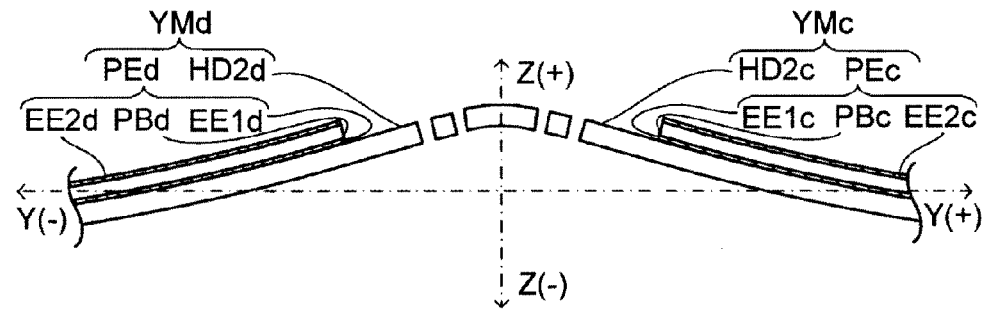
[FIG. 4B] A cross sectional view taken along line B-B' in FIG. 1, showing movement of normal rotation with respect to the mirror axis.
Figure 4C:
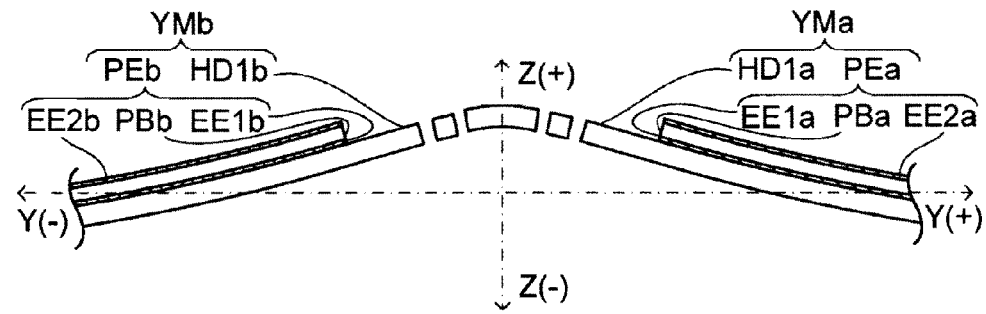
[FIG. 4C] A cross sectional view taken along line A-A' in FIG. 1, showing movement of reverse rotation with respect to the mirror axis.
Figure 4D:
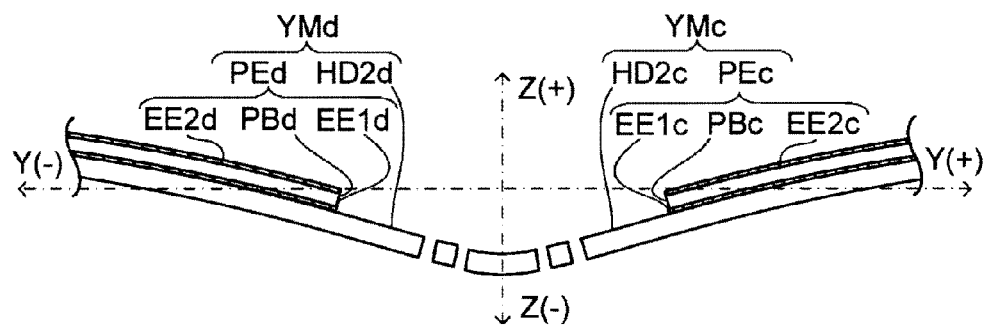
[FIG. 4D] A cross sectional view taken along line B-B' in FIG. 1, showing movement of reverse rotation with respect to the mirror axis.

Next, the swinging of the mirror MR with respect to the mirror axis MA (the Y axis) will be described with reference to FIG. 1 and FIGS. 4A to 4D. It is assumed that one direction {clockwise rotation as viewed from Y (+) to Y (−)} with respect to the mirror axis MA be normal rotation P, and rotation (counterclockwise rotation) in the reverse direction with respect to the normal rotation be reverse rotation R. FIGS. 4A and 4B show deformation of the first and second holders HD1 and HD2 in a case where the mirror MR rotates in the normal direction. FIGS. 4C and 4D show deformation of the first and second holders HD1 and HD2 in a case where the mirror MR rotates in the reverse direction. Note that FIGS. 4A and 4C are cross sectional views taken along line A-A' in FIG. 1, and FIGS. 4B and 4D are cross sectional views taken along line B-B' in FIG. 1.

As shown in FIG. 4A, in a case where the mirror MR rotates with respect to the mirror axis MA in the normal direction, in the first holder HD1, a voltage for expanding the piezoelectric members PBa and PBb in the piezoelectric elements PEa and PEb is applied. When such a voltage is applied, due to the expanding piezoelectric members PBa and PBb, both the holding strip HD1a—to which the first electrode EE1a is attached—of the first holder HD1 and the holding strip HD1b—to which the first electrode EE1b is attached—of the first holder HD1 warp so as to bulge toward the Z (+) side. Consequently, the first frame axis FA1 sides of the holding strip HD1a and the holding strip HD1b sag toward Z (−), and the first frame axis FA1 is displaced toward Z (−) also.

On the other hand, as shown in FIG. 4B, in the second holder HD2, a voltage for contracting the piezoelectric members PBc and PBd in the piezoelectric elements PEc and PEd is applied. When such a voltage is applied, due to the contracting piezoelectric members PBc and PBd, both the holding strip HD2c—to which the first electrode EE1c is attached—of the second holder HD2 and the holding strip HD2d—to which the first electrode EE1d is attached—of the second holder HD2 warp so as to bulge toward the Z (−) side. Consequently, the second frame axis FA2 sides of the holding strip HD2c and the holding strip HD2d spring up toward Z (+), and the second frame axis FA2 is displaced toward Z (+) also.

When the first holder HD1 makes the first frame axis FA1 be displaced toward Z (−) and the second holder HD2 makes the second frame axis FA2 be displaced toward Z (+) as described above, the movable frame FM held by the first frame axis FA1 and the second frame axis FA2 tilts. When the movable frame FM tilts in this way, the mirror MR included in the movable frame FM also tilts with respect to the mirror axis MA. This tilting is caused by the displacements of the first frame axis FA1 and the second frame axis FA2 that are located away, approximately at equal intervals, from the mirror axis MA. Thus, with respect to the mirror axis MA, the mirror MR rotates with respect to the mirror axis MA in the normal direction.

Next, as shown in FIG. 4C, in a case where the mirror MR rotates with respect to the mirror axis MA in the reverse direction, a voltage for contracting the piezoelectric members PBa and PBb of the piezoelectric elements PEa and PEb is applied. When such a voltage is applied, due to the contracting piezoelectric members PBa and PBb, the holding strip HD1a and the holding strip HD1b in the first holder HD1 warp so as to bulge toward the Z (−) side. Consequently, the first frame axis FA1 sides of the holding strip HD1a and the holding strip HD1b spring up toward Z (+), and the first frame axis FA1 is displaced toward Z (+) also.

On the other hand, as shown in FIG. 4D, a voltage for expanding the piezoelectric members PBc and PBd of the piezoelectric elements PEc and PEd is applied. When such a voltage is applied, due to the expanding piezoelectric members PBc and PBd, the holding piec HD2c and the holding strip HD2d in the second holder HD2 warp so as to bulge toward the Z (+) side. Consequently, the second frame axis FA2 sides of the holding strip HD2 and the holding strip HD2d sag toward Z (−), and the second frame axis FA2 is displaced toward Z (−) also.

When the first holder HD1 makes the first frame axis FA1 be displaced toward Z (+) and the second holder HD2 makes the second frame axis FA2 be displaced toward Z (−) as described above, as in the case with the normal rotation, the movable frame FM tilts, and in turn the mirror MR rotates with respect to the mirror axis MA in the reverse direction.

It should be noted, however, that the rotation angles θ (the inclination angles θ) of the normal/reverse rotations of the mirror MR with respect to the mirror axis MA—the Y axis—as described above is comparatively small. Thus, in the optical scanner LS, the frequency of the voltage applied to the piezoelectric element PE (PEa to PEd) for tilting the movable frame FM is the frequency around the resonance frequency of rotational vibration of the mirror MR with respect to the mirror axis MA. The reason for this is that, even though the amount of tilting of the movable frame FM is comparatively small, the mirror MR resonates with the frequency of the voltage applied to the piezoelectric element PE and swings comparatively greatly.

In brief, the optical scanner LS includes the mirror axis MA and the frame axis FA having axis directions different from each other; the holder HD that is deformed in order to displace those two axes MA and FA; the piezoelectric element PE that generates, in response to a voltage applied thereto, a force for deforming the holder HD; and the mirror MR swinging, on one hand, with respect to the mirror axis MA according the displacement of the mirror axis MA and, on the other hand, with respect to the frame axis FA according to the displacement of the frame axis FA.

In the optical scanner LS, the mirror axis MA is displaced by resonating it in response to the frequency of the voltage applied to the piezoelectric element PE, whereas the frame axis FA is displaced by the deformation of the holder HD alone.

It is possible to calculate the resonance frequency of the optical scanner LS by commercial simulation software so long as the following are clear: Yong's modulus, Poisson ratio, and the density in the base member BS, and in addition the shape and the fixing conditions of the mirror MR, the piezoelectric constant of the piezoelectric element PE, etc.

Figure 5:
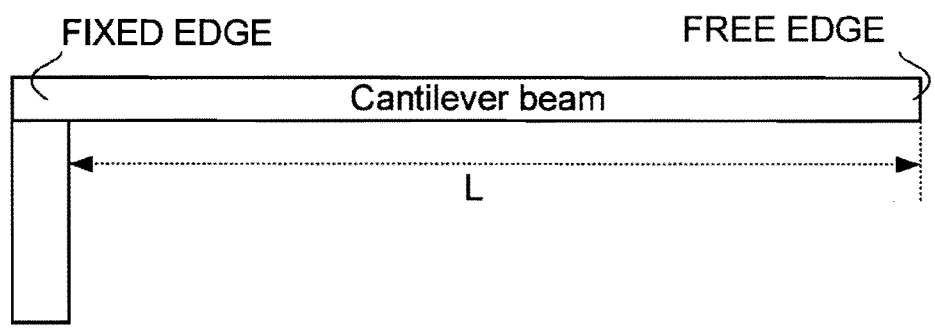
[FIG. 5] A diagram illustrating a model system of a cantilever beam in which a part of a holding strip connected to a fixing frame is a fixed end and a part of a holding strip closer to a first frame axis is a free end.
Figure 6A:
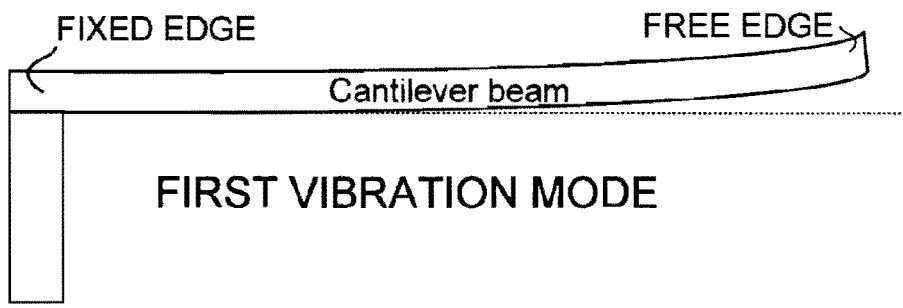
[FIG. 6A] A diagram illustrating a model system that vibrates in first vibration mode.
Figure 6B:
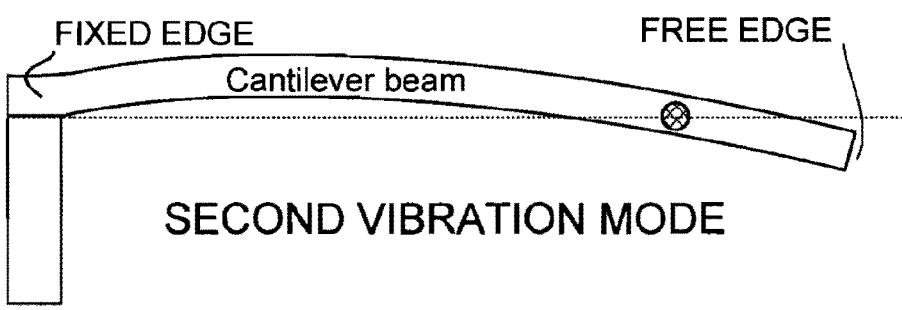
[FIG. 6B] A diagram illustrating a model system that vibrates in second vibration mode.
Figure 6C:
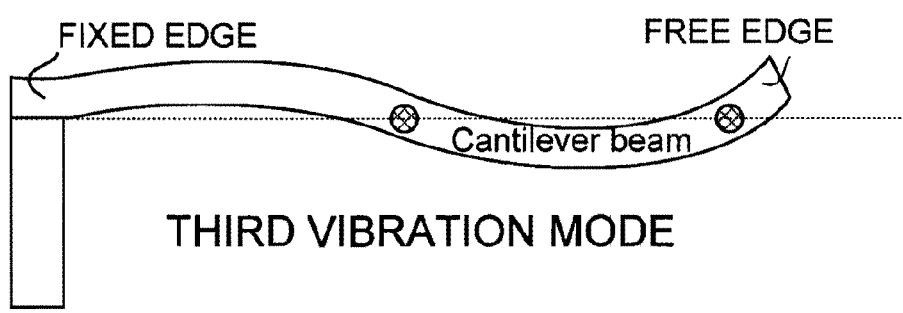
[FIG. 6C] A diagram illustrating a model system that vibrates in third vibration mode.
Figure 6D:
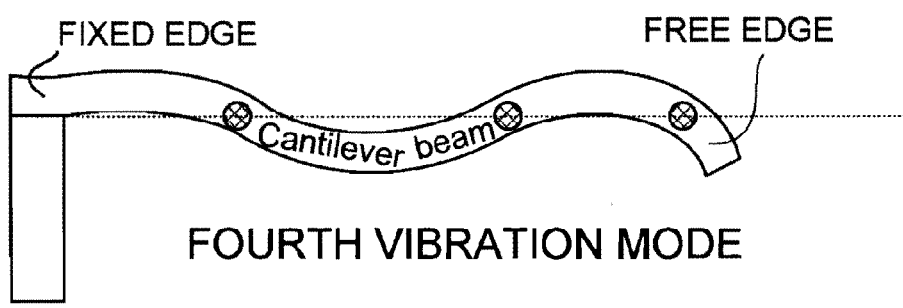
[FIG. 6D] A diagram illustrating a model system that vibrates in fourth vibration mode.
Figure 7A:
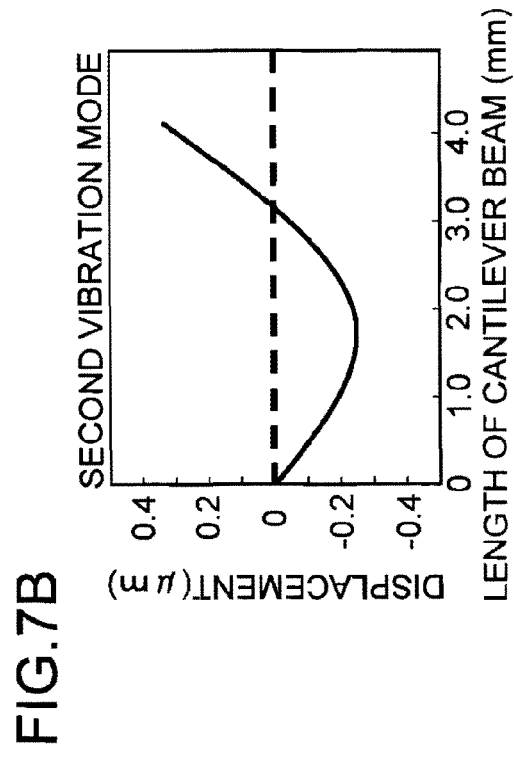
[FIG. 7A] A diagram in which the amount of displacement of a cantilever beam in first vibration mode is graphed.
Figure 7B:
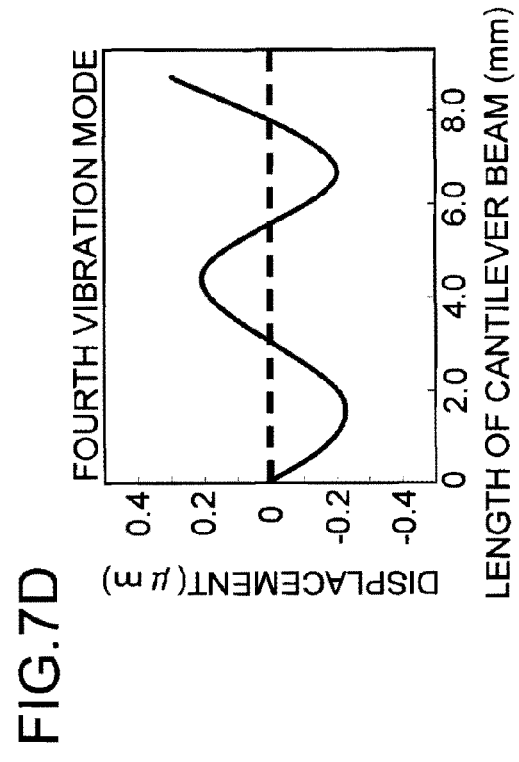
[FIG. 7B] A diagram in which the amount of displacement of the cantilever beam in second vibration mode is graphed.
Figure 7C:
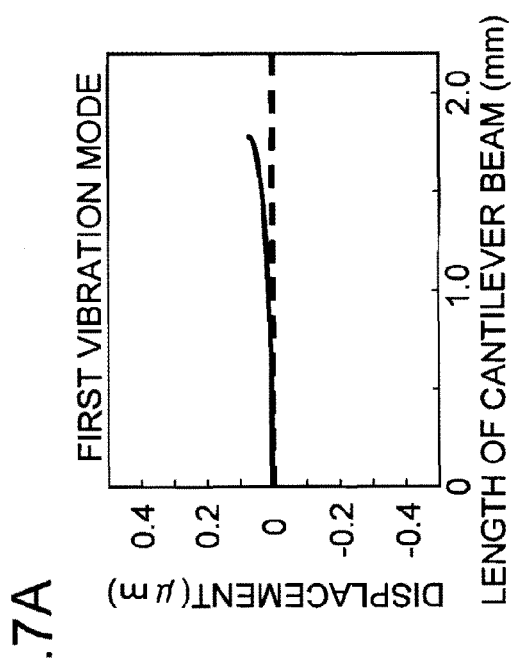
[FIG. 7C] A diagram in which the amount of displacement of the cantilever beam in third vibration mode is graphed.
Figure 7D:
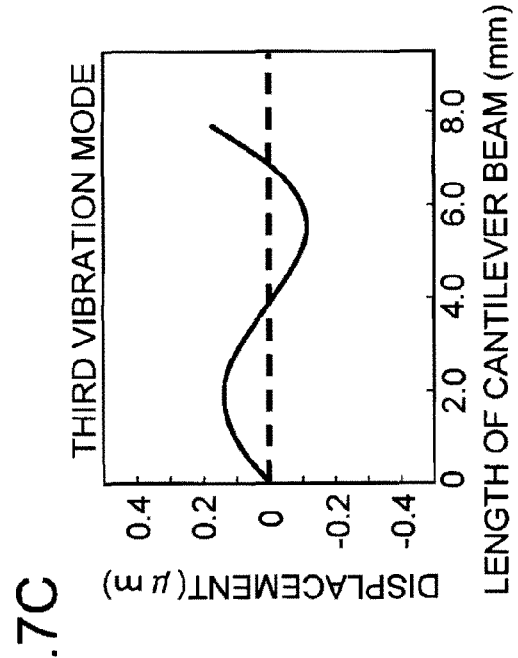
[FIG. 7D] A diagram in which the amount of displacement of the cantilever beam in fourth vibration mode is graphed.

A description will now be given of the deformation of the holder HD, particularly of a desirable deformation of the holder HD in a case where the mirror MR is rotated with respect to the mirror axis MA, and of the frequency of the voltage applied to the piezoelectric element PE for deforming the holder HD. In the description, a model system of a cantilever beam shown in FIG. 5 is taken up as an example. In the model system, a side of the holding strip HD1a which is connected to the fixing frame FF is a fixed end, and a side of the holding strip HD1a which is close to the first frame axis FA1 is a free end.

First, let the flexural rigidity in the cantilever beam be EI, the density be $\rho$, the cross section be A, and the vibration velocity be v, then, the equation of motion of the free transverse vibration of Bernoulli Euler cantilever beam is represented by the following equation (1). The number of dots over a variable denotes the order of time differential.

[Equation 1]

$$(EIv'')'' + \rho A \ddot{v} = 0 \qquad (1)$$

It is assumed here that the free transverse vibration of the cantilever beam is a harmonic motion represented by the following equation (2). Note that x denotes the displacement, t denotes time, $\omega$ denotes the vibration frequency, and $\alpha$ denotes the initial phase.

[Equation 2]

$$v(x,t) = V(x)\cos(\omega t - \alpha) \qquad (2)$$

Then, equation (1) becomes the following eigenequation (3).

[Equation 3]

$$(EIv'')'' + \rho A \omega^2 V = 0 \qquad (3)$$

As a result, the equation of free vibration of a uniform cantilever beam is converted into the following equation (4) or equation (5).

[Equation 4]

$$\frac{d^4 V}{dx^4} - \lambda^4 V = 0 \qquad (4)$$

[Equation 5]

$$\lambda^4 = \frac{(\rho A \omega^2)}{EI} \qquad (5)$$

In equation (4) and equation (5), $\lambda$ denotes the wavelength. Then, as described below, the relationship between f and the length of the cantilever beam, namely L, is represented by the following equation (6).

[Equation 6]

$$f = \frac{(\lambda_r L)^2}{2\pi L^2}\left[\frac{EI}{\rho A}\right]^{\frac{1}{2}} \qquad (6)$$

Note that r of $\lambda_r$ denotes the order of vibration mode.

The general solution of the cantilever beam that warps and vibrates is represented by the following equation (7).

[Equation 7]

$$V(x) = C_1 \sin h\lambda x + C_2 \cos h\lambda x + C_3 \sin \lambda x + C_4 \cos \lambda x \qquad (7)$$

$C_1$, $C_2$, $C_3$, and $C_4$ in equation (7) are determined by the boundary condition. Here, since warping and vibration in one end fixation is dealt with, such boundary conditions as the following equations (8) to (11) are given.

[Equation 8]

$$V(0) = 0 \qquad (8)$$

[Equation 9]

$$\left.\frac{dV}{dx}\right|_{x=0} = 0 \qquad (9)$$

[Equation 10]

$$\left.\frac{d^2 V}{dx^2}\right|_{x=L} = 0 \qquad (10)$$

[Equation 11]

$$\left.\frac{d^3 V}{dx^3}\right|_{x=L} = 0 \qquad (11)$$

Applying those boundary conditions to above equation (7) determines a characteristic equation such as the following equation (12). By this equation, the frequency constant ($\lambda_r L$) is found, which is the product of the wavelength $\lambda$ and the length L of the beam.

[Equation 12]

$$\cos \lambda L \cos h\lambda L + 1 = 0 \qquad (12)$$

Specifically, the frequency constants in first to fourth vibration modes are represented by the following equations (13) to (16). The first to fourth vibrations of the cantilever beam are shown briefly in FIGS. 6A to 6D respectively. Nodes (points at which the amplitude is zero under steady state oscillation; see cross hatched regions) shown in those diagrams occur so as to intersect (at a right angle or the like) with respect to the length of the cantilever beam.

[Equation 13]

$$\lambda_1 L = 1.8751 \qquad (13)$$

[Equation 14]

$$\lambda_2 L = 4.6941 \qquad (14)$$

[Equation 15]

$$\lambda_3 L = 7.8548 \qquad (15)$$

[Equation 16]

$$\lambda_4 L = 10.996 \qquad (16)$$

When the resonance frequencies are determined from the above equations (13) to (16) and from equation (5), the lengths of the cantilever beam in the first to fourth vibration modes are derived. Here, for example, when a Young's modulus of 130 GPa, a density of 2300 kg/m$^3$, and a cross sectional area of 0.2 mm$^2$ are set as the material physical properties of the cantilever beam to calculate the length L [mm] of the cantilever beam required at resonance frequencies of 10 kHz, 20 kHz, and 30 kHz, the following Table 1 is obtained.

TABLE 1

| RESONANCE FREQUENCY (kHz) | LENGTH OF CANTILEVER BEAM VIBRATION MODE | | | |
|---|---|---|---|---|
| | 1 | 2 | 3 | 4 |
| 10 | 2.6 mm | 6.4 mm | 10.5 mm | 15.0 mm |
| 20 | 1.8 mm | 4.5 mm | 7.6 mm | 10.5 mm |
| 30 | 1.5 mm | 3.9 mm | 6.4 mm | 8.9 mm |

The equation of the vibration of the cantilever beam is represented by the following equation (17) or equation (18) (note that C is a given vibration constant). When x, which makes the displacement zero, is calculated from equation (17) or (18), that value indicates the position of the node.

[Equation 17]

$$V(x) = C\{\cosh(\lambda_r x) - \cos(\lambda_r x) - k_r[\sinh(\lambda_r x) - \sin(\lambda_r x)]\} \quad (17)$$

[Equation 18]

$$k_r \frac{\cosh(\lambda_r L) + \cos(\lambda_r L)}{\sinh(\lambda_r L) + \sin(\lambda_r L)} \quad (18)$$

As is apparent from Table 1, in order to cause high frequency resonance in the same vibration mode, specifically, in order to make the mirror MR swing with respect to the mirror axis MA at high speed (to make it scan at high speed), the length L of the cantilever beam needs to be short (it is considered that the cantilever beam corresponds to the holding strip HD1a, the holding strip HD1b, the holding strip HD2a, and the holding strip HD2b).

However, when the cantilever beam has a comparatively short length L, it is generally less likely to warp (for example, the displacement of the free end of the cantilever beam tends to be small). Thus, in swinging of the mirror MR with respect to the frame axis FA—swinging without resonance—, the required displacement amount of the frame axis FA, that is, the displacement amount of the first frame axis FA1 sides of the holding strip HD1a and the holding strip HD1b and the displacement amount of the second frame axis FA2 sides of the holding strip HD2a and the holding strip HD2b are comparatively small.

In short, when the length of the holder HD (the holding strip HD1a, the holding strip HD1b, the holding strip HD2a, the holding strip HD2b) is short, although the mirror MR scans with respect to the mirror axis MA at high speed, the rotation angle θ of mirror MR with respect to the frame axis FA is small. To overcome such an inconvenience, the length of the holder HD may be increased. However, if the holder HD is long, it is impossible for the mirror MR to swing with respect to the mirror axis MA at high speed.

In other words, the holder HD—the cantilever beam—needs to fulfill contradictory requirements in order to rotate the mirror MR with respect to the frame axis FA comparatively greatly without resonance, and to swing the mirror MR with respect to the mirror axis MA at high speed and at a great rotation angle. However, as shown in FIGS. 7A to 7D which are diagrams in which the displacement amounts of the cantilever beam in different first to fourth vibration modes in a case where the cantilever beam resonates at about 30 kHz is graphed, even though the cantilever beam is comparatively long, the displacement amount of the free end of the cantilever beam in the second to fourth vibration modes (multiple order vibration modes) with nodes is larger than the displacement amount of the free end of the cantilever beam in the first vibration mode without node.

Then, so long as the holder HD is formed so as to cause vibration mode with a node, it is possible for the mirror MR to scan with respect to the mirror axis MA at high speed, even though the holder HD is comparatively long in order to secure the angle of rotation—rotation without resonance with respect to the frame axis FA—of the mirror MR.

Accordingly, in a case where the optical scanner LS resonates at the frequency of the voltage applied to the piezoelectric element PE, preferably, that frequency vibrates the holder HD such that at least one node is generated that intersects with respect to the length of the holder HD itself.

[Other Embodiments]

It should be understood that the present invention may be carried out in any manner other than specifically described above as an embodiment, and many modifications and variations are possible within the scope and spirit of the present invention.

For example, in a case where a mirror MR rotates with respect to a mirror axis MA by use of the resonance of an optical scanner LS, preferably, the frequency of the voltage applied to a piezoelectric element PE is approximate to or equal to the natural frequency of the optical scanner LS (a system including a mirror axis MA, a frame axis FA, a holder HD, a piezoelectric element PE, a mirror MR and a fixing frame FF). The reason is that, with such relationship being held (with the frequency of the applied voltage being approximate to or equal to the natural frequency of the optical scanner LS), the mirror MR swings with respect to the mirror axis MA comparatively greatly (in short, a great rotation angle is obtained).

In addition, further preferably, the natural frequency of the optical scanner LS is approximate to or equal to the natural frequency of a unimorph YM (a system including a holder HD and a piezoelectric element PE). The reason for this is that the mirror MR swings with respect to the mirror axis MA even more comparatively greatly.

Figure 8:
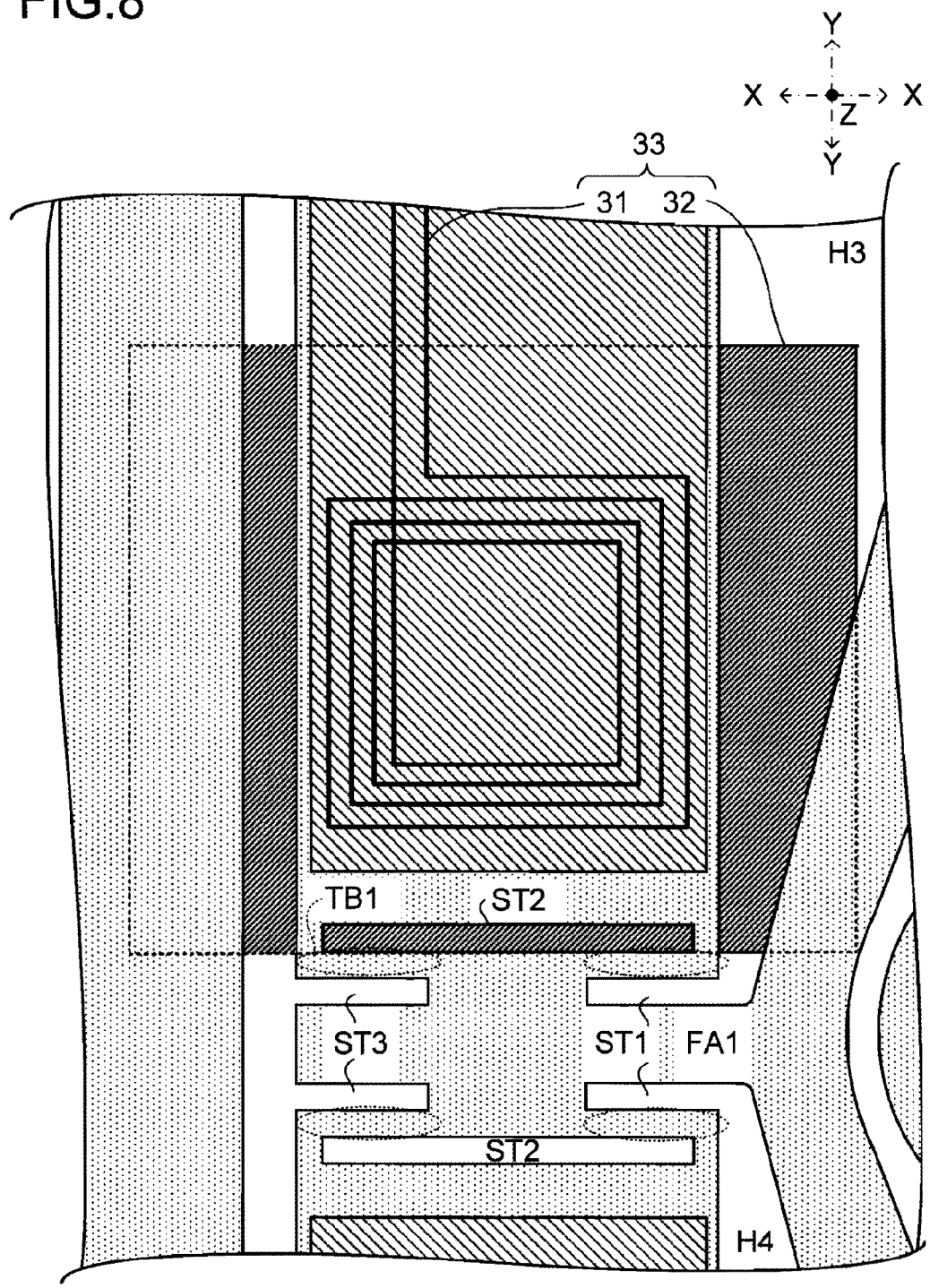
[FIG. 8] A plan view of an optical scanner adopting an electromagnetic system.

A drive portion of a piezoelectric system is not limited to a unimorph; it may be a bimorph. Moreover, a member (a drive portion) that deforms the holder HD is not limited to the piezoelectric element PE. For example, as shown in FIG. 8, an electromagnetic unit 33 formed of an electromagnetic coil 31 and a permanent magnet 32 may serve as the drive portion (may serve as the drive portion of the electromagnetic system). Such an electromagnetic unit 33 has the electromagnetic coil 31 located on one face (the obverse face) of the holder HD, and has the permanent magnet 32 located at the rear side (to be apart from the reverse face of the holder HD) of the holder HD, so as to warp the holder HD by the electromagnetic force produced by the electromagnetic coil 31 and the permanent magnet 32.

Moreover, an electrostatic unit formed of two electrodes may serve as the drive portion (may serve as the drive portion of an electrostatic system). Such an electrostatic unit has one electrode located on the reverse face of the holder HD, and has the other electrode located apart from the reverse face of the holder HD (at the rear side of the holder HD), so as to warp the holder HD by the electrostatic force produced by the two electrodes. In short, the drive portion may be of any of the electromagnetic system, the electrostatic system, the piezoelectric system, and another system, so long as it is able to deform the holder HD.

For example, in a case with the drive portion of the electrostatic system, preferably, the frequency of the voltage applied to the electrodes is approximate to or equal to the natural frequency of the optical scanner LS (a system including the mirror axis MA, the frame axis FA, the holder HD, the mirror MR, and the fixing frame FF). Furthermore, the natural frequency of the optical scanner LS is preferably approximate to the natural frequency of the holder HD. The reason for this is that, like in the case where the drive portion is the unimorph YM, the mirror MR swings with respect to the mirror axis MA comparatively greatly.

Figure 9:
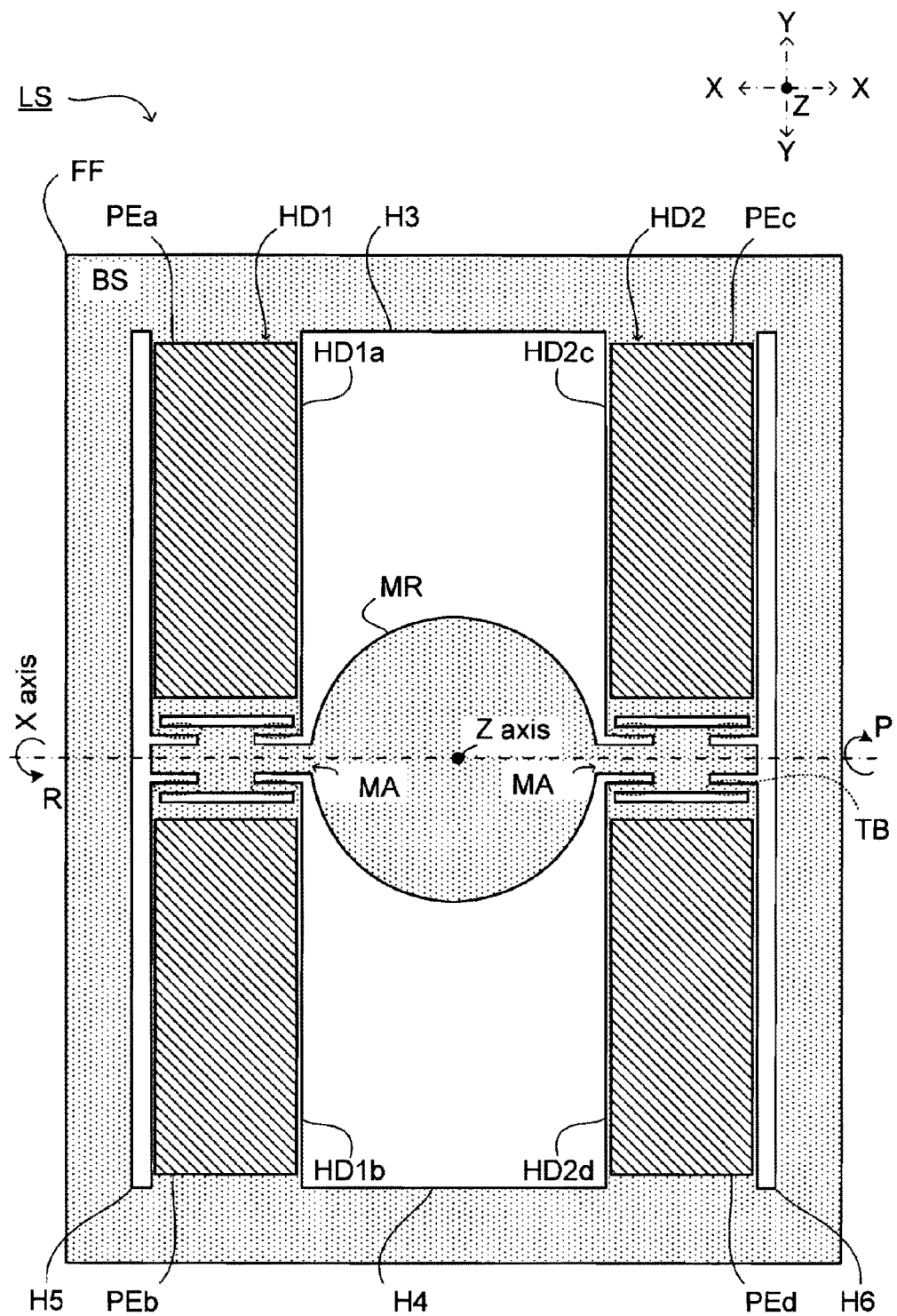
[FIG. 9] A plan view of a one dimensional optical scanner.

In the above description, a two dimensional optical scanner LS is taken up as an example. This, however, is not meant to be any limitation; for example, the optical scanner LS may be a one dimensional optical scanner LS as shown in FIG. 9.

In this optical scanner LS, a mirror MR is directly connected to a holder HD via a mirror axis MA. Specifically, the optical scanner LS includes the mirror axis (an axis portion) MA, the holder HD that is deformed in order to displace the mirror axis MA, a piezoelectric element PE that generates, in response to a voltage applied thereto, a force for deforming the holder HD, and the mirror MR that swings with respect to the mirror axis MA according to the displacement of the mirror axis MA.

The displacement of the mirror axis MA is caused by resonance, and the frequency of the voltage applied to the piezoelectric element PE is a frequency around the resonance frequency of the rotation vibration of the mirror MR. Besides, the frequency of the applied voltage that causes resonance is also a frequency that generates in the holder HD at least one node that intersects with respect to the length of the holder HD itself.

That is, even with this optical scanner LS, workings and benefits as described in the first embodiment are achieved. Needless to say, even in this first dimensional optical scanner LS, the frequency of the voltage applied to the piezoelectric element PE is preferably approximate to or equal to the natural frequency of the optical scanner LS (a system including the mirror axis MA, the holder HD, the piezoelectric element PE, the mirror MR, and a fixing frame FF). In addition, further preferably, the natural frequency of the optical scanner LS is approximate to the natural frequency of a unimorph YM. The reason for this is that the mirror MR swings with respect to the mirror axis MA comparatively greatly.

As in the two dimensional optical scanner LS, also in the one dimensional scanner LS, a drive portion may be of an electrostatic system. In this case, preferably, the frequency of the voltage applied to electrodes is approximate to or equal to the natural frequency of the optical scanner LS (a system including the mirror axis MA, the holder HD, the mirror MR, and the fixing frame FF). Further preferably, the natural frequency of the optical scanner LS is approximate to the natural frequency of the holder HD. The reason for this is that, as in the case where the drive portion is the unimorph YM, the mirror MR swings with respect to the mirror axis MA comparatively greatly.

Incidentally, the optical scanners LS described above are provided in micro scanner devices (optical devices) which various types are assumed (such micro scanner devices include a drive circuit that applies a voltage to a piezoelectric element PE). A projector (an image projector) as shown in a block diagram of FIG. 10 is taken up as an example of the micro scanner devices.

Figure 10:
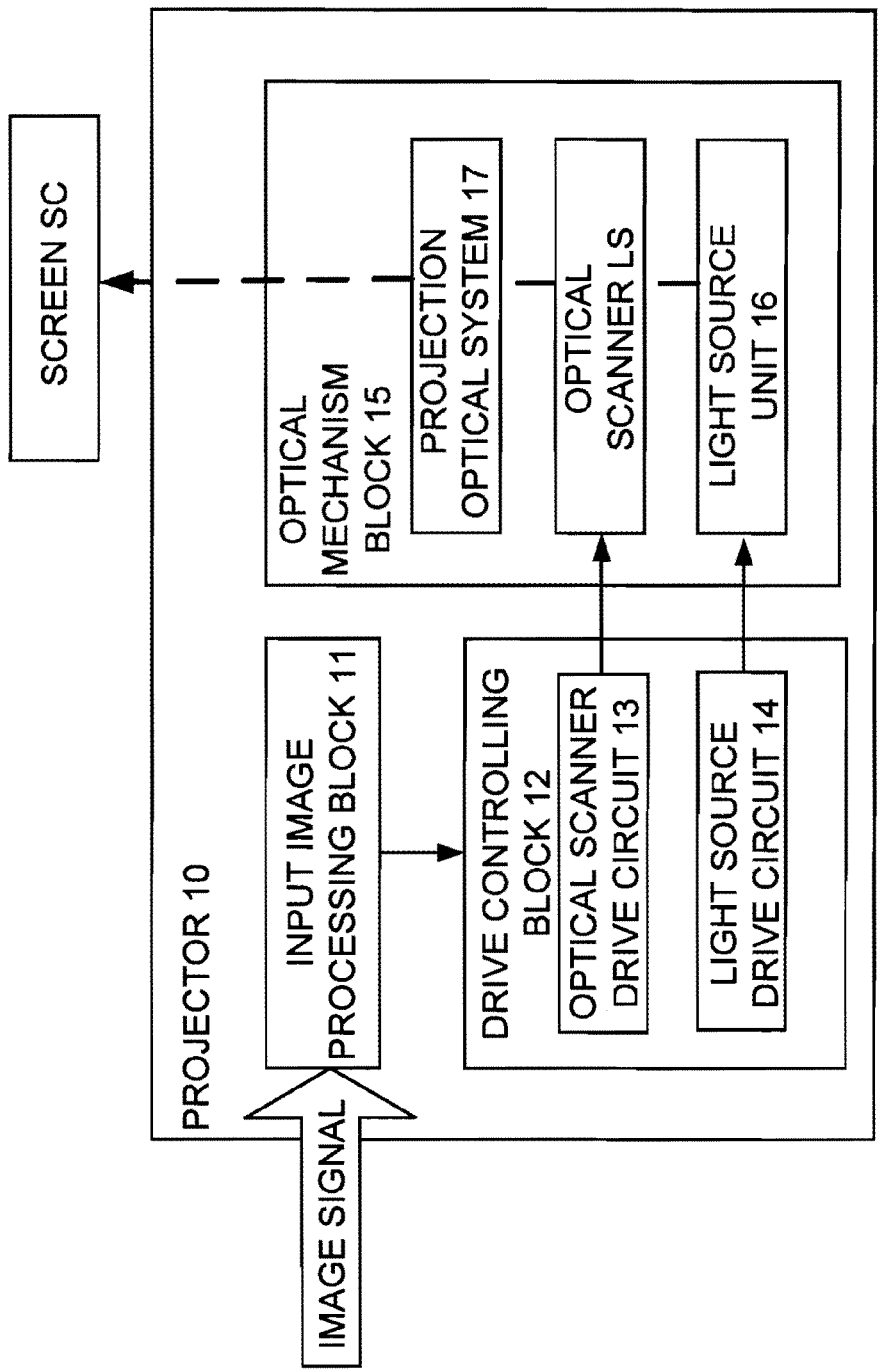
[FIG. 10] A block diagram showing a projector.
Figure 11A:
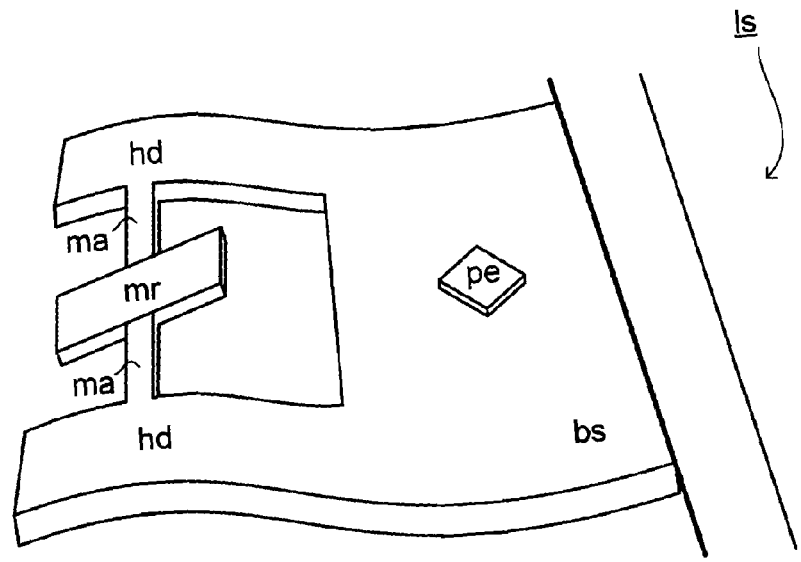
[FIG. 11A] A perspective view of a conventional optical scanner in which a mirror swings in one direction.
Figure 11B:
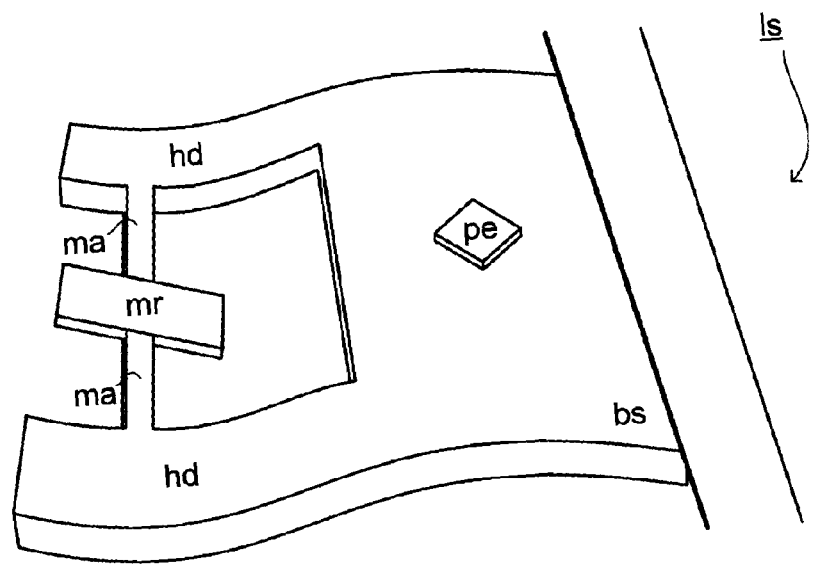
[FIG. 11B] A perspective view of a conventional optical scanner in which a mirror swings in a direction opposite to the direction in which the mirror in FIG. 11A rotates.

The projector 10 shown in FIG. 10 includes an input image processing block 11, a drive controlling block 12, and an optical mechanism block 15.

The input image processing block 11 receives an image signal (such as a NTSC signal) transmitted from a personal computer (PC) or the like. Then, the input image processing block 11 applies, as necessary, correction (γ correction, distortion correction of an image, or the like) to the received image signal, and transmits the corrected image signal to the drive controlling block 12.

The drive controlling block 12 is configured with dedicated electronic circuitry, and includes an optical scanner drive circuit (a drive circuit) 13 and a light source drive circuit 14.

The optical scanner drive circuit 13 generates a control signal for controlling the driving timing of an optical scanner LS to correspond to a vertical synchronizing signal and a horizontal synchronizing signal of the transmitted image signal. Then, the optical scanner drive circuit 13 transmits a drive signal of a potential corresponding to the control signal to the optical scanner LS included in the optical mechanism block 15.

The optical scanner drive circuit 13 applies to a piezoelectric element PE a voltage having a frequency that is approximate to or equal to the natural frequency of the optical micro scanner LS itself and that generates in a holder HD at least one node that intersects with respect to the length of the holder HD.

The light source drive circuit 14 controls light emission of a later described light source unit 16 (specifically, a light emitting block included in the light source unit 16) included in the optical mechanism block 15. Specifically, the light source drive circuit 14 makes the light source unit 16 emit light having color and luminance according to the gradation of the transmitted image signal. The timing for making the light source unit 16 illuminate corresponds to the vertical synchronizing signal and the horizontal synchronizing signal of the image signal.

The optical mechanism block 15 includes the light source unit 16, the optical scanner LS, and a projection optical system 17, and projects light onto a screen SC (a projecting surface).

The light source unit 16 includes, for example, a group of light emitting blocks where light emitting blocks such as lasers gather and a group of collimator lenses where collimator lenses that convert light from the light emitting blocks into an approximately parallel bundle of rays gather. The group of light emitting blocks includes a red light emitting block, a green light emitting block, and a blue light emitting block. The group of collimator lenses includes three collimator lenses to correspond to the light emitting blocks of different colors. Each light emitting block generates and emits a laser beam with a luminance according to a pixel value of a pixel signal from the light source drive circuit 14.

The optical scanner LS is the optical scanner LS itself described above. In brief, the optical scanner LS has a mirror MR that reflects light traveling from the light source unit 16 and, by rotating the mirror MR with respect to two respective axes (a mirror axis MA and a frame axis FA) that are substantially orthogonal to each other, reflects light two dimensionally to deflect it (scan).

The projection optical system 17 leads, as necessary, the light deflected by the optical scanner LS onto the screen SC—the projecting surface—to project a moving image onto the screen SC. In FIG. 10, a dotted line arrow indicates light (a laser beam) from the light source unit 16 to the optical scanner LS, further to the projection optical system 17, and reaching the screen SC.

As an example of a micro scanner device other than a projector 10 as shown in FIG. 10, there is an image forming apparatus such as a copier and a printer. With such a micro scanner device, it is possible to realize high speed scanning and provision of high resolution images.

Examples of micro scanners other than optical scanners include those that are provided with, instead of a mirror MR, a lens (a refraction optical system) or a light source (a light emitting block).

The invention claimed is:
1. A micro scanner device comprising:
a fixing frame serving as an outer frame;
a first axis portion and a second axis portion having axis directions different from one another;
a holder having a cantilever beam structure in which a first end of the holder is connected to the second axis portion and a second end of the holder is fixed to the fixing frame;
a drive portion generating, in response to a voltage applied thereto, a force for deforming the holder;
a moving portion swinging with respect to the first axis portion according to displacement of the first axis por- tion, the moving portion swinging with respect to the second axis portion according to displacement of the second axis portion; and a drive circuit applying to the drive portion a voltage, the voltage being configured to cause deformation of the drive portion, the deformation of the drive portion being configured to cause the deformation of the holder, the deformation of the holder being configured to cause displacement of both the first axis portion and the second axis portion, the displacement of both the first axis portion and the second axis portion being configured to cause a first rotation of the moving portion with respect to the first axis portion and a second rotation of the moving portion with respect to the second axis portion, the first rotation being made with resonance at higher speed than the second rotation, wherein the drive circuit applies to the drive portion a voltage having a frequency that is approximate to or equal to a natural frequency of the micro scanner itself and that generates in the holder at least one node intersecting with respect to a length of the holder.

2. The micro scanner device according to claim 1, wherein a natural frequency of a system including the holder and the drive portion is approximate to or equal to a natural frequency of a system including the first axis portion, the second axis portion, the holder, the drive portion, the moving portion, and the fixing frame which surrounds the first axis portion, the second axis portion, the holder, the drive portion, and the moving portion.

3. The micro scanner device according to claim 2, wherein a natural frequency of the holder is approximate to or equal to a natural frequency of a system including the first axis portion, the second axis portion, the holder, the moving portion, and the fixing frame which surrounds the first axis portion, the second axis portion, the holder, and the moving portion.

4. The micro scanner device according to claim 1, wherein the drive circuit applies to the drive portion a voltage having a frequency that causes such deformation as to generate the intersecting node at a position deviated from an interconnection between the holder and the fixing frame toward the first end of the holder.

5. The micro scanner device according to claim 4, wherein said node is generated at a position closer to the first end of the holder than to the second end of the holder.

6. The micro scanner device according to claim 1,
wherein the moving portion comprises a minor, a movable frame surrounding the mirror, and the first axis portion comprising two first axis sections, one of the first axis sections connecting one end of the minor with the movable frame, and the other of the first axis sections connecting the other end of the minor with the movable frame,
wherein the second axis portion comprises two second axis sections, one of the second axis sections holding one end of the moving portion, and the other of the second axis sections holding the other end of the moving portion,
wherein the holder comprises two pairs of holders, each pair holding both ends of each second axis section, and
wherein the drive portion comprises driver sections, each driver section being arranged on surfaces of each holder, the driver sections being driven by drive signals having the same phase or opposite phases.

7. A method for controlling a micro scanner device comprising a micro scanner and a drive circuit,
wherein the micro scanner includes:
a fixing frame serving as an outer frame;
a first axis portion and a second axis portion having axis directions different from one another;
a holder having a cantilever beam structure in which a first end of the holder is connected to the second axis portion and a second end of the holder is fixed to the fixing frame;
a drive portion generating, in response to a voltage applied thereto, a force for deforming the holder;
a moving portion swinging with respect to the first axis portion according to displacement of the first axis portion, the moving portion swinging with respect to the second axis portion according to displacement of the second axis portion; and
a drive circuit applying to the drive portion a voltage, the voltage being configured to cause deformation of the drive portion, the deformation of the drive portion being configured to cause the deformation of the holder, the deformation of the holder being configured to cause displacement of both the first axis portion and the second axis portion, the displacement of both the first axis portion and the second axis portion being configured to cause a first rotation of the moving portion with respect to the first axis portion and a second rotation of the moving portion with respect to the second axis portion, the first rotation being made with resonance at higher speed than the second rotation,
wherein a voltage is applied to the drive portion by the drive circuit, the voltage having a frequency that is approximate to or equal to a natural frequency of the micro scanner itself and that generates in the holder at least one node intersecting with respect to a length of the holder.

8. The micro scanner device according to claim 7, wherein the drive circuit applies to the drive portion a voltage having a frequency that causes such deformation as to generate the intersecting node at a position deviated from an interconnection between the holder and the fixing frame toward the first end of the holder.

9. The micro scanner device according to claim 8, wherein said node is generated at a position closer to the first end of the holder than to the second end of the holder.

10. The micro scanner device according to claim 7,
wherein the holder comprises holders arranged at both ends of the second axis portion symmetrically about the second axis portion, and
wherein the drive portion comprises driver sections arranged on surfaces of the holders, the driver sections being driven by drive signals having a same phase or opposite phases.

11. The method of claim 7,
wherein the moving portion comprises a minor, a movable frame surrounding the mirror, and the first axis portion comprises two first axis sections, one of the first axis sections connecting one end of the minor with the movable frame, and the other of the first axis sections connecting the other end of the minor with the movable frame,
wherein the second axis portion comprises two second axis sections, one of the second axis sections holding one end of the moving portion, and the other of the second axis sections holding the other end of the moving portion,
wherein the holder comprises two pairs of holders, each pair holding both ends of each second axis portion, and
wherein the drive portion comprises driver sections, each driver section being arranged on surfaces of each holder, the driver sections being driven by drive signals having the same phase or opposite phases.

12. A micro scanner device comprising:
a fixing frame serving as an outer frame;
a first axis portion and a second axis portion having axis directions different from one another;
a holder having a cantilever beam structure in which a first end of the holder is connected to the second axis portion and a second end of the holder is fixed to the fixing frame;
a drive portion generating, in response to a voltage applied thereto, a force for deforming the holder;
a moving portion swinging with respect to the first axis portion according to displacement of the first axis portion, and the moving portion swinging with respect to the second axis portion according to displacement of the second axis portion; and
a drive circuit,
wherein the second axis portion is displaced by deformation of the holder alone whereas the first axis portion is displaced with resonance occurring by displacement resulting from deformation of the holder,
wherein the drive circuit applies to the drive portion a voltage having a frequency that is approximate to or equal to a natural frequency of the micro scanner itself and that generates in the holder at least one node intersecting with respect to a length of the holder,
wherein the moving portion comprises a minor, a movable frame surrounding the mirror, and the first axis portion comprises two first axis sections, one of the first axis sections connecting one end of the minor with the movable frame, and the other of the first axis sections connecting the other end of the minor with the movable frame,
wherein the second axis portion comprises two second axis sections, one of the second axis sections holding one end of the moving portion, and the other of the second axis sections holding the other end of the moving portion,
wherein the holder comprises two pairs of holders, each pair holding both ends of each second axis section, and
wherein the drive portion comprises driver sections, each driver section being arranged on surfaces of each holder, the driver sections being driven by drive signals having the same phase or opposite phases.

13. A method for controlling a micro scanner device comprising a micro scanner and a drive circuit,
wherein the micro scanner includes:
a fixing frame serving as an outer frame;
a first axis portion and a second axis portion having axis directions different from one another;
a holder having a cantilever beam structure in which a first end of the holder is connected to the second axis portion and a second end of the holder is fixed to the fixing frame;
a drive portion generating, in response to a voltage applied thereto, a force for deforming the holder; and
a moving portion swinging with respect to the first axis portion according to displacement of the first axis portion, the moving portion swinging with respect to the second axis portion according to displacement of the second axis portion,
wherein the second axis portion is displaced by deformation of the holder alone, and the first axis portion is displaced with resonance occurring by displacement resulting from deformation of the holder,
wherein a voltage is applied to the drive portion by the drive circuit, the voltage having a frequency that is approximate to or equal to a natural frequency of the micro scanner itself and that generates in the holder at least one node intersecting with respect to a length of the holder,
wherein the moving portion comprises a minor, a movable frame surrounding the mirror, and the first axis portion comprises two first axis sections, one of the first axis sections connecting one end of the minor with the movable frame, and the other of the first axis sections connecting the other end of the minor with the movable frame,
wherein the second axis portion comprises two second axis sections, one of the second axis sections holding one end of the moving portion, and the other of the second axis sections holding the other end of the moving portion,
wherein the holder comprises two pairs of holders, each pair holding both ends of each second axis portion, and
wherein the drive portion comprises driver sections, each driver section being arranged on surfaces of each holder, the driver sections being driven by drive signals having the same phase or opposite phases.

* * * * *